United States Patent
Twitchen et al.

(10) Patent No.: US 11,060,204 B2
(45) Date of Patent: Jul. 13, 2021

(54) SINGLE CRYSTAL SYNTHETIC DIAMOND MATERIAL VIA CHEMICAL VAPOUR DEPOSITION

(71) Applicant: ELEMENT SIX TECHNOLOGIES LIMITED, Didcot (GB)

(72) Inventors: Daniel James Twitchen, Didcot (GB); Harpreet Kaur Dhillon, Didcot (GB); Rizwan Uddin Ahmad Khan, Maidenhead (GB)

(73) Assignee: Element Six Technologies Limited, Didcot (GB)

( * ) Notice: Subject to any disclaimer, the term of this patent is extended or adjusted under 35 U.S.C. 154(b) by 308 days.

(21) Appl. No.: 16/464,351

(22) PCT Filed: Nov. 30, 2017

(86) PCT No.: PCT/EP2017/080903
§ 371 (c)(1),
(2) Date: May 28, 2019

(87) PCT Pub. No.: WO2018/100024
PCT Pub. Date: Jun. 7, 2018

(65) Prior Publication Data
US 2021/0115590 A1    Apr. 22, 2021

(30) Foreign Application Priority Data
Dec. 1, 2016 (GB) .................... 1620413

(51) Int. Cl.
*C30B 29/04* (2006.01)
*C30B 25/18* (2006.01)
(Continued)

(52) U.S. Cl.
CPC ............ *C30B 29/04* (2013.01); *C30B 25/186* (2013.01); *C30B 25/205* (2013.01); *C30B 33/04* (2013.01); *C30B 33/12* (2013.01)

(58) Field of Classification Search
CPC ...... C30B 29/04; C30B 25/186; C30B 25/205; C30B 33/04; C30B 33/12; C01B 32/25; C01B 32/28; C23C 16/27
See application file for complete search history.

(56) References Cited

U.S. PATENT DOCUMENTS

| 4,465,932 A | 8/1984 | Burgemeister |
| 2007/0054124 A1 | 3/2007 | Gill et al. |
| (Continued) | | |

FOREIGN PATENT DOCUMENTS

| EP | 2985368 A1 | 2/2016 |
| WO | 0196633 A1 | 12/2001 |
| (Continued) | | |

OTHER PUBLICATIONS

United Kingdom Patent Application No. GB1620413.3, Search Report dated Jul. 4, 2017, 5 pages.
United Kingdom Patent Application No. GB1719899.5 Search Report dated Sep. 11, 2018, 4 pages.
International Patent Application No. PCT/EP2017/080903, International Search Report and Written Opinion dated Jan. 25, 2018, 12 pages.

*Primary Examiner* — Robert M Kunemund
(74) *Attorney, Agent, or Firm* — Dean W. Russell; Clark E Weight; Kilpatrick Townsend & Stockton LLP

(57) ABSTRACT

There is described a single crystal CVD diamond material comprising three orthogonal dimensions of at least 2 mm; one or more regions of low optical birefringence, indicative of low strain, such that in a sample of the single crystal CVD diamond material having a thickness in a range 0.5 mm to 1.0 mm and an area of greater than 1.3 mm×1.3 mm and measured using a pixel size of area in a range 1×1 μm² to 20×20 μm², a maximum value of $\Delta n_{[average]}$ does not exceed $1.5 \times 10^{-4}$ for the one or more regions of low optical bire- (Continued)

fringence, where $\Delta n_{[average]}$ is an average value of a difference between refractive index for light polarised parallel to slow and fast axes averaged over the sample thickness; one or more regions of high optical birefringence, indicative of high strain, such that in said sample of the single crystal CVD diamond material and measured using said pixel size, $\Delta n_{[average]}$ is greater than $1.5 \times 10^{-4}$ and less than $3 \times 10^{-3}$; and is wherein every 1.3 mm×1.3 mm area of the sample of the single crystal CVD diamond material comprises at least one of said regions of high optical birefringence. There is also described a method of making the CVD diamond material.

20 Claims, 1 Drawing Sheet

(51) Int. Cl.
    *C30B 25/20*     (2006.01)
    *C30B 33/04*     (2006.01)
    *C30B 33/12*     (2006.01)

(56) References Cited

U.S. PATENT DOCUMENTS

| | | | |
|---|---|---|---|
| 2010/0119790 A1* | 5/2010 | Dodge | B01J 3/062 |
| | | | 428/212 |
| 2014/0335339 A1 | 11/2014 | Dhillon et al. | |
| 2014/0356276 A1 | 12/2014 | Godfried et al. | |
| 2016/0348277 A1* | 12/2016 | Markham | C30B 25/186 |

FOREIGN PATENT DOCUMENTS

| | | |
|---|---|---|
| WO | 0196634 A1 | 12/2001 |
| WO | 03052174 A2 | 6/2003 |
| WO | 03052177 A1 | 6/2003 |
| WO | 2004046427 A1 | 6/2004 |
| WO | 2005061400 A1 | 7/2005 |
| WO | 2006136929 A2 | 12/2006 |
| WO | 2007066215 A2 | 6/2007 |
| WO | 2016024564 A1 | 2/2016 |
| WO | 2018100024 A1 | 6/2018 |

* cited by examiner

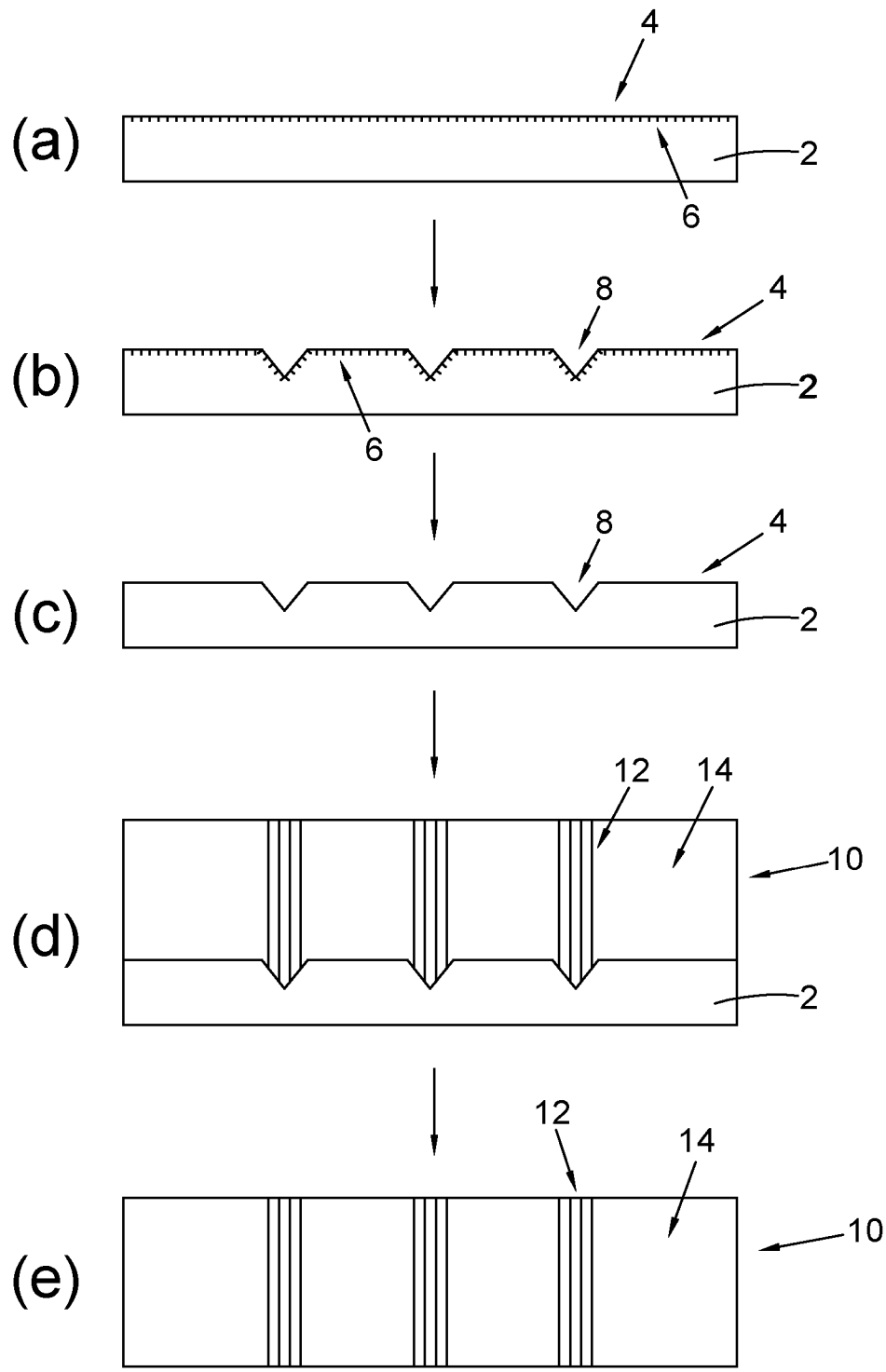

SINGLE CRYSTAL SYNTHETIC DIAMOND MATERIAL VIA CHEMICAL VAPOUR DEPOSITION

FIELD

The present invention relates to single crystal chemical vapour deposited (CVD) synthetic diamond material and particularly to the synthesis of relatively thick layers of single crystal CVD synthetic diamond material engineered to have particular crystallographic characteristics.

BACKGROUND

In the 1980s and 1990s much research was performed by various groups around the world directed to the synthesis of single crystal CVD diamond material. Much of this work disclosed growth of thin layers of single crystal CVD diamond material on single crystal diamond substrates via homoepitaxial growth. While there was a desire to fabricate relatively thick layers of high quality single crystal CVD synthetic diamond material, this proved difficult to achieve in practice. Synthesis of single crystal CVD diamond material requires extreme conditions which need to be generated and then maintained in a stable fashion over extended time periods to successfully grow thick layers of high quality single crystal CVD synthetic diamond material. Furthermore, the nature of the diamond material which is synthesized is sensitive to numerous synthesis parameters forming a complex multi-dimensional synthesis parameter space. Only small areas of this multi-dimensional synthesis parameter space are capable of achieving thick layers of high quality single crystal CVD synthetic diamond material. Finding these synthesis regimes, and developing methodologies for generating the correct combination of parameters required to produce and maintain stable growth within one of these synthesis regimes is far from trivial.

In the early 2000s, Element Six Ltd (De Beers Group) filed a series of patent applications directed to the growth of high quality single crystal CVD synthetic diamond materials of a number of different types. These patent applications were based on extensive research over many years developing an understanding of the multi-dimensional synthesis parameter space for single crystal CVD diamond materials and developing methodologies for generating and maintaining the correct combination of parameters required to produce and maintain stable growth within selected synthesis regimes.

Synthesis parameters of importance to single crystal CVD diamond growth were found to include substrate type, substrate processing and growth surface preparation, substrate geometry, substrate temperature and thermal management, microwave power, gas pressure, gas composition and flow rate. The correct combination of these parameters needs to be selected, generated, and maintained in a stable fashion and many of these parameters are interrelated such that if one parameter is changed then others must also be changed in the correct manner in order to remain in a stable growth regime. Some examples of Element Six Ltd patent applications filed in the 2000s are briefly discussed below.

For certain applications it is desirable to minimize the number of defects, or at least certain types of defect, within the diamond lattice structure. For example, for certain electronic applications such as radiation detectors or semiconductive switching devices it is desirable to minimize the number of charge carriers inherent in the diamond material and increase the mobility of charge carriers intentionally introduced into the material in use. Such a material may be engineered by fabricating a single crystal CVD synthetic diamond material which has a low concentration of impurities which would otherwise introduce charge carriers into the diamond lattice structure. Patent literature relevant to such electronic/detector grade single crystal CVD synthetic diamond material includes WO01/096633 and WO01/096634.

For certain optical applications it is desirable to provide a material which has low optical absorbance and low optical birefringence. Such a material may be engineered by fabricating a single crystal CVD synthetic diamond material which has a low concentration of impurities, which would otherwise increase the optical absorbance of the material, and a low concentration of extended defects which would otherwise introduce anisotropic strain into the diamond lattice structure causing birefringence. Patent literature relevant to such optical grade single crystal CVD synthetic diamond material includes WO2004/046427 and WO2007/066215.

In contrast to the low defect materials described above, for certain applications it is desirable to intentionally introduce a significant but controlled quantity, type, and distribution of defects into the diamond lattice structure. For example, introducing boron into the diamond lattice by providing a boron containing gas within the CVD process gases provides an acceptor level within the band structure of the diamond material thus forming a p-type semi-conductor. If extremely high levels of boron are introduced into the diamond lattice structure the material shows metal-like conductivity. Such materials are useful as electrodes, as electrochemical sensing electrodes, and in electronic applications. Patent literature relevant to such boron doped single crystal CVD synthetic diamond material includes WO03/052174.

Another example is that of nitrogen doped single crystal CVD synthetic diamond materials. Nitrogen is one of the most important dopants in CVD diamond material synthesis as it has been found that providing nitrogen in the CVD process gas increases the growth rate of the material and can also affect the formation of crystallographic defects such as dislocations. As such, nitrogen doping of single crystal CVD synthetic diamond materials has been extensively investigated and reported in the literature. Nitrogen doped CVD synthetic diamond material tends to be brown in colour. As such, for the previously discussed applications, such as optical applications, it has been found to be advantageous to develop techniques which intentionally exclude nitrogen from the CVD process gases. However, for applications such as mechanical applications where optical, electronic, and quantum coupling parameters are not a concern, nitrogen doping to significant levels can be useful in achieving growth of thick layers of CVD synthetic diamond material. Patent literature relevant to such nitrogen doped single crystal CVD synthetic diamond material includes WO2003/052177.

For certain applications, it has also been found to be advantageous to utilize a synthesis methodology which involves introducing two or more dopants into the CVD synthesis process. For example, as described previously, nitrogen doped CVD synthetic diamond material tends to be brown in colour. However, it has been found that if a co-dopant such as boron or silicon is introduced into the synthesis process in combination with nitrogen then it is possible to fabricate colourless or near colourless single crystal CVD diamond material at nitrogen levels which would otherwise result in a brown colouration. Patent literature relevant to such co-doped single crystal CVD synthetic diamond material includes WO2006/136929.

Co-doping can also be used as a means of intentionally introducing one or more layers of distinctive doped material into a single crystal CVD diamond as a way of identifying the material as synthetic without detrimentally affecting the visual quality of the material. For example, a colourless or near colourless single crystal CVD diamond can be manufactured which has one or more layers of co-doped material which are not visible under normal viewing conditions but which are visible under fluorescent conditions. Such an approach is described in WO2005/061400.

Finally, EP2985368 (Sumitomo) suggests incorporating a range of different types of defects into single crystal CVD diamond material for mechanical tool applications in order to suppress chipping. To achieve this mechanical tool component a grooved substrate, ion implantation, and relatively high levels of methane and nitrogen were utilized to create a range of defects within the product material. Single crystal CVD diamond product of varying lateral dimensions was achieved but at relatively low thicknesses of 0.7 mm.

In light of the above, it will be evident that single crystal CVD diamond materials come in a range of different forms and can be engineered to have a range of different properties for particular applications.

SUMMARY OF INVENTION

One of the most important synthesis regimes for commercial applications is that described in WO2004/046427. As described in the background section of the present specification, WO2004/046427 is directed to the fabrication of single crystal CVD diamond material with low optical absorbance and low optical birefringence. While such a material has found to be required for certain optical applications, the synthesis regime as described therein has also been found to be useful for applications which do not necessarily require all the advantageous optical qualities of the product material. For example, even for applications which do not require low optical birefringence, it has been found that the synthesis methodology as described in WO2004/046427 can be advantageous for commercial production as it allows high quality, thick, single crystal CVD diamond to be consistently manufactured which relatively good growth rates and with relatively high yields compared to other processes. The reason why this is the case is tied to the mechanism by which dislocation defects are formed in single crystal CVD diamond material and how this is controlled to achieve low birefringence single crystal CVD diamond material in accordance with WO2004/046427.

The characteristics of the area of parameter space required to achieve the invention according to the WO2004/046427 patent application are described on pages 14 and 15 of the patent specification. Effectively, to synthesize the low birefringence product of WO2004/046427 requires: (i) a low defect substrate; (ii) correct processing of the growth surface of the substrate; and (iii) selection and control of the growth conditions as described on pages 14 to 15 of the patent specification. Surface characteristics of the single crystal CVD diamond material during growth are of critical importance. In a high purity growth regime pits form in the growth surface leading to dislocation multiplication during growth and a high birefringence single crystal CVD diamond product. In a high nitrogen growth regime dislocation formation is also observed resulting in a high birefringence single crystal CVD diamond product. This is considered to be associated with pits formed in the growth surface (e.g. during the pre-growth etch phase to remove polishing damage) which are not filled in during a fast growth rate, high nitrogen diamond growth process leading to dislocation formation and high birefringence. Problems of pitting and dislocation multiplication increase on growing relatively thick layers of single crystal CVD diamond. The invention of the WO2004/046427 patent is concerned with finding a window in synthesis parameter space where pitting and dislocation multiplication is reduced or minimized allowing a thick, low birefringence, single crystal CVD diamond material to be fabricated. The layer of product material has low birefringence over substantially all of its area, i.e. there are no regions of the product layer of single crystal CVD diamond which have a high birefringence.

It has also been found that by reducing pitting and dislocation multiplication, internal stress is lowered which would otherwise cause cracking of the single crystal CVD diamond material and lowering of yield in at least a proportion of the product material. Furthermore, the mechanism by which this is achieved with the addition of a low and controlled concentration of nitrogen in combination with a suitable substrate selection and preparation methodology and selection of suitable power, pressure, and gas composition and flow rates, results in growth rates which are commercially viable for thick, high quality single crystal CVD diamond products for a range of applications. Accordingly, the combination of good growth rates and good yields make this synthesis regime attractive for commercial applications even when the product material is not required to be of low birefringence.

The present inventors have realized that many of the benefits of the approach described in WO2004/046427 can be realized without requiring the product layer of single crystal CVD diamond to have substantially no regions of high birefringence. This modified approach utilizes the same type of approach to that described in WO2004/046427 in order to avoid uncontrolled dislocation multiplication during growth of thick layers of single crystal CVD diamond material leading to an uncontrolled increase in stress and an associated increase in the rate of cracking and yield loss. However, the presently described approach differs in that a controlled amount of stress is engineered into the product material from the outset by processing the substrate to introduce features which seed isolated regions of high stress and associated birefringence in a single crystal CVD diamond material grown thereon. Several features are required in order to ensure that the process is reproducible, has consistently good yields, and results in a consistent and well defined product. These features include: (i) consistent and controlled nucleation and propagation of dislocations in specified regions of the single crystal CVD diamond material during growth resulting in regions which have a controlled amount of stress and associated birefringence which is higher than the limits specified in WO2004/046427 but which is sufficiently low that cracking of the material is avoided; (ii) a low level of dislocation nucleation and propagation except in those areas where dislocations have been intentionally engineered into the material; and (iii) a CVD growth process similar to that described in WO2004/046427 where pitting and dislocation multiplication is reduced or minimized during growth to avoid uncontrolled dislocation multiplication during growth of thick layers of single crystal CVD diamond material leading to an uncontrolled increase in stress and an associated increase in the rate of cracking and yield loss. Effectively the process introduces a controlled degree of stress into selected regions of an otherwise low stress material and controls the process to prevent significant increases in stress during growth of thick layers of single crystal CVD diamond material thus enabling thick (>2 mm) layers of single crystal CVD diamond to be manufactured without cracking but with regions of high birefringence. The process is capable of achieving a single crystal CVD diamond product which is colourless or near colourless and is otherwise of high crystal quality with good optical characteristics except for those regions of high stress and birefringence which have been controllably engineered into the material. The regions of high stress, either through their optical birefringence or luminescent characteristics, can be used to tag/mark diamonds. For example, it is possible to write specific patterns or letters into the diamond which are impossible to remove. Furthermore, the engineered strain patterns can be used for controlling optical and electronic spin properties of the diamond material.

Thus, controllably introducing isolated regions of high stress and birefringence into single crystal CVD diamond material can have a number of benefits. Distinctive patterns of higher birefringence material can be engineered into surrounding low birefringence single crystal CVD diamond material as a method of personalizing the single crystal CVD diamond for an end customer. For example, a customer's initials or other desired design can be engineered into a single crystal CVD diamond as a dislocation pattern by suitable patterning of the growth substrate to provide a unique product. Alternatively, a supplier could engineer a unique dislocation pattern into their diamond products as a marker indicating the source of their products. Further still, using the methodology described herein isolated regions of strain can be controllably introduced into single crystal CVD diamond material to tailor its mechanical, optical, and electronic spin properties for particular applications.

In light of the above, according to a first aspect of the present invention there is provided a single crystal CVD diamond material comprising:

three orthogonal dimensions of at least 2 mm;
one or more regions of low optical birefringence, indicative of low strain, such that in a sample of the single crystal CVD diamond material having a thickness in a range 0.5 mm to 1.0 mm and an area of greater than 1.3 mm×1.3 mm and measured using a pixel size of area in a range 1×1 µm$^2$ to 20×20 µm$^2$, a maximum value of $\Delta n_{[average]}$ does not exceed $1.5 \times 10^{-4}$ for the one or more regions of low optical birefringence, where $\Delta n_{[average]}$ is an average value of a difference between refractive index for light polarised parallel to slow and fast axes averaged over the sample thickness;
one or more regions of high optical birefringence, indicative of high strain, such that in said sample of the single crystal CVD diamond material and measured using said pixel size, $\Delta n_{[average]}$ is greater than $1.5 \times 10^{-4}$ and less than $3 \times 10^{-3}$; and
wherein every 1.3 mm×1.3 mm area of the sample of the single crystal CVD diamond material comprises at least one of said regions of high optical birefringence.

According to a second aspect of the present invention there is provided a method of fabricating a single crystal CVD diamond material according to the first aspect of the invention, the method comprising:

preparing a plurality of single crystal diamond substrates, each substrate having a growth surface comprising:
one or more regions for nucleating dislocations to form said one or more regions of high optical birefringence in the single crystal CVD diamond material grown thereon; and
one or more low defect regions to form said one or more regions of low optical birefringence in the single crystal CVD diamond material grown thereon, wherein the one or more low defect regions have a density of defects such that surface etch features related to defects formed by a revealing plasma etch is below $5 \times 10^3$/mm$^2$; and
growing at least 2 mm×2 mm×2 mm of the single crystal CVD diamond material on the growth surface of each of the single crystal diamond substrates while controlling CVD diamond growth conditions in order to fabricate the single crystal CVD diamond material according to the first aspect of the invention.

The methodology differs from that described in WO2004/046427 in that a controlled level of high birefringence is intentionally engineered into portions of the product material rather than all regions being of low birefringence. The methodology also differs from that described in EP2985368 in that instead of manufacturing thin (<1 mm thick) layers of highly defective material for mechanical applications the present invention allows thick (>2 mm) layers of single crystal CVD diamond to be manufactured with controlled regions of high birefringence separated by low defect material.

BRIEF DESCRIPTION OF THE DRAWINGS

For a better understanding of the present invention and to show how the same may be carried into effect, embodiments of the present invention will now be described by way of example only with reference to the accompanying drawings, in which:

FIG. 1 illustrates the basic steps involved in fabricating a single crystal CVD diamond material according to the present invention.

DETAILED DESCRIPTION

As described in the summary of invention section of this specification, the key to achieving the present invention is to provide a methodology which achieves a single crystal CVD diamond product material with controlled regions of high, but not too high, birefringence separated by low defect material.

The basic methodology is illustrated in FIG. 1. Steps (a) to (c) are concerned with creating the correct density and form of substrate structures for nucleating the correct amount of dislocations to produce high strain regions while nucleating few dislocations outside these regions.

In step (a), a single crystal diamond substrate 2 is selected which has a low concentration of defects at a growth surface 4 thereof. For example, a single crystal diamond substrate is selected which has a low density of dislocations intersecting the growth surface. The substrate selection is similar to that described in WO2004/046427 for fabricating low birefringence material. Such a substrate will still have some surface and sub-surface damage 6 at the growth surface as a result of polishing for example.

In step (b), one or more regions 8 for nucleating dislocations are processed into the growth surface 4 of the single crystal diamond substrate 2. The single crystal diamond substrates may be prepared by ablating the growth surface of each of the single crystal diamond substrates with ablated regions forming the one or more regions 8 for nucleating dislocations. Pits or trenches can be ablated into the growth surface by laser ablation, electron beam, or another suitable processing technique. A masked plasma etching technique may also be used to form pits or trenches in the single crystal diamond substrates. Furthermore, it has been found to be advantageous to provide non-circular features and most preferably features which are oriented along one of the principle crystallographic directions of the diamond substrate and overgrown single crystal CVD diamond material, e.g. {100}, {110}, etc.

The depth, width, shape and spacing of the features is critical as this will determine the amount of strain generated in single crystal CVD diamond material grown thereon. For example, a substrate surface feature 8 may have a depth in a range 5 to 100 µm, a width in a range 5 to 500 µm, and a spacing in a range 50 µm to 1.3 mm. For example, while laser scoring of the substrate surface can introduce sources of dislocations and fine laser grooves can give rise to high dislocation densities and samples not prone to cracking, coarse laser grooves can lead to sample cracking (excess strain induced) when a thick layer of single crystal CVD diamond material is grown.

The features may have tapered walls which can be formed using the natural shape of a cutting beam or via a benching routine. Alternatively, if a highly collimated cutting beam is utilized then the walls of the surface features may be substantially vertical.

As an alternative to ablated pits or trenches, the one or more regions for nucleating dislocations may be formed by implanting, e.g. ions or via other irradiation, the growth surface of each of the single crystal diamond substrates to from highly damaged regions which form the one or more regions for nucleating dislocations.

Key to the processing is to form isolated regions of the growth surface which generate the desired amount of stress or strain, via dislocation nucleation, in the single crystal CVD diamond grown thereon while the surrounding regions of single crystal CVD diamond retain a low stress, strain, and birefringence.

In step (c), the growth surface 4 of the single crystal diamond substrate 2 is etched, e.g. via plasma etching, after forming the one or more regions 8 for nucleating dislocations and prior to growth of single crystal CVD diamond thereon. The etching is controlled to remove processing damage 6 from the one or more low defect regions to ensure that the single crystal CVD diamond material overlying these regions will have a low birefringence in a similar manner to WO2004/046427. For example, the one or more low defect regions on the growth surface of the substrate may have a density of defects such that surface etch features related to defects formed by a revealing plasma etch is below $5 \times 10^3/\text{mm}^2$.

However, it is also critical not to fully remove the one or more regions 8 for nucleating dislocations during etching such that these regions are in a form capable of generating sufficient dislocations in the single crystal CVD diamond material grown thereon to form the high birefringence regions. The ability to control birefringence in the high strain regions is a function of both the size and shape of the features 8 processed into the growth surface 4 in step (b) and the way these features are modified by the etching in step (c). For example, etching can reduce the depth of the features 8 and round edges of the features, both of which will tend to lower the amount of stress which is generated in product material grown thereon. In step (d), at least 2 mm×2 mm×2 mm of single crystal CVD diamond material 10 is grown on the growth surface 4 the single crystal diamond substrates 2. For example, CVD diamond growth conditions may be controlled in accordance with the following parameters:

a gas phase composition comprising a carbon source gas and hydrogen, wherein the carbon source gas forms between 3 and 7% of the gas phase composition and nitrogen is present in a gas phase concentration of 300 ppb to 2 ppm;

a substrate temperature in a range 700° C. to 1050° C.;

a pressure in a range 90 to 400 torr; and a microwave power in a range 3 to 60 kW for substrate diameters in a range 25 to 300 mm.

Early stage CVD diamond growth should be controlled to ensure that the correct amount of dislocations are nucleated in high strain regions 12. For example, certain growth processes, such as very slow growth processes using a high purity CVD process, where diamond growth and etching are finally balanced, can result in the substrate surface features being etched or filled in during the early growth phase without nucleating sufficient dislocations to generate the desired amount of strain. Similarly, certain growth processes such as fast growth rate processes using significant levels of nitrogen, can overgrow the nucleating structures in such a way as to generate too much stress in the overgrown single crystal CVD diamond material. As such, it has been found that the ability to control birefringence in the high strain regions 12 is not only a function of both the size and shape of the features 8 processed into the growth surface 4 in step (b) and the way these features are modified by the etching in step (c) as previously indicated, but also a function of the parameters used in the early stages of single crystal CVD diamond growth.

Furthermore, after the earlier stage of single crystal CVD diamond growth, even if the correct levels of dislocations and strain is generated, the CVD diamond growth process must be controlled to suppress dislocation multiplication and thus control the level of strain through a thick layer of single crystal CVD diamond material 10. A different growth process may be utilized for the early CVD diamond growth phase as compared to the process conditions used for the majority of the single crystal CVD diamond material 10 to ensure that the correct number of dislocations is generated prior to switching to a growth regime which suppresses dislocation multiplication during the main growth phase. For example, according to certain embodiments it has been found to be advantageous to grow a thin layer of high purity single crystal CVD diamond material initially (e.g. according to WO2001/096633) and then move to a synthesis processes which uses low and controlled nitrogen addition (e.g. according to WO2004/046427).

After growth the original substrate 2 can be removed (e.g. via laser cutting, electron beam, or some other method) to yield a free-standing single crystal CVD diamond product 10 as illustrated in step (e) of FIG. 1. Alternatively, the single crystal CVD diamond material 10 can be retained on the substrate 2 and processed into a product incorporating the substrate and the single crystal CVD diamond material.

The single crystal CVD diamond material 10 fabricated using the methodology describe herein comprises:

three orthogonal dimensions of at least 2 mm;

one or more regions of low optical birefringence 14, indicative of low strain, such that in a sample of the single crystal CVD diamond material having a thickness in a range 0.5 mm to 1.0 mm and an area of greater than 1.3 mm×1.3 mm and measured using a pixel size of area in a range $1 \times 1$ µm$^2$ to $20 \times 20$ µm$^2$, a maximum value of $\Delta n_{[average]}$ does not exceed $1.5 \times 10^{-4}$ for the one or more regions of low optical birefringence, where $\Delta n_{[average]}$ is an average value of a difference between refractive index for light polarised parallel to slow and fast axes averaged over the sample thickness;

one or more regions of high optical birefringence 12, indicative of high strain, such that in said sample of the single crystal CVD diamond material and measured using said pixel size, a maximum value of $\Delta n_{[average]}$ is greater than $1.5 \times 10^{-4}$ and less than $3 \times 10^{-3}$; and wherein every 1.3 mm×1.3 mm area of the sample of the single crystal CVD diamond material comprises at least one of said regions of high optical birefringence.

The one or more regions of low optical birefringence may preferably have a maximum value of $\Delta n_{[average]}$ which does not exceed $8 \times 10^{-5}$ or more preferably $5 \times 10^{-5}$.

The one or more regions of high optical birefringence may have a $\Delta n_{[average]}$ value which is greater than $2.5 \times 10^{-4}$ or $5 \times 10'$, a $\Delta n_{[average]}$ value which is less than $2.5 \times 10^{-3}$, $2 \times 10^{-3}$, or $1 \times 10^{-3}$, or a $\Delta n_{[average]}$ value within a range defined by any combination of these upper and lower values.

The one or more regions of high optical birefringence each comprise a plurality of dislocations extending laterally in a line across the single crystal CVD diamond material or may each comprise a bundle of dislocations at a point localized in lateral dimensions of the single crystal CVD diamond material. The one or more regions of high optical birefringence may each have a width in a range 5 to 500 μm. Where a plurality of the regions of high optical birefringence are provided, the regions of high optical birefringence can be spaced apart by a distance in a range 50 μm to 1.3 mm. The geometry of the regions of high optical birefringence will depend on the geometry of the features provided in the substrate on which the single crystal CVD diamond material is grown. As such, the regions can be controlled so as to be configured in a regular pattern rather than a random distribution. For example, the regions of high birefringence are equally spaced.

The optical birefringence in the regions of low and high optical birefringence may be measured in a direction of highest birefringence to within ±10°. This will generally correspond to the growth direction of the single crystal CVD diamond material and corresponds to the primary direction of dislocations propagating through the material.

The one or more regions of high optical birefringence may each have an area of at least 100 μm×100 μm. When measuring the birefringence of the regions of high optical birefringence with an array of small pixels it is possible that not every one of the pixels will exhibit high birefringence. However, at least 80% of the pixels in the one or more regions of high optical birefringence have $\Delta n_{[average]}$ greater than $1.5 \times 10^{-4}$ and less than $3 \times 10^{-3}$. Furthermore, in terms of an entire sample comprising regions of high and low birefringence, at least 2% of a total number of pixels in every 1.3 mm×1.3 mm area of a sample of the single crystal CVD diamond material form the one or more regions of high optical birefringence.

Optionally, the single crystal CVD diamond material has a neutral single substitutional nitrogen) ($N_s^0$) concentration in a range $3 \times 10^{15}$ atoms/cm$^3$ to $5 \times 10^{17}$ atoms/cm$^3$ as measured by electron paramagnetic resonance and for certain applications a tighter range of less than $2 \times 10^{17}$ atoms/cm$^3$ and/or more than $1 \times 10^{16}$ atoms/cm$^3$ is desirable. Furthermore, the single crystal CVD diamond material preferably has a low optical absorption such that a sample of a specified thickness (0.5 mm to 1.0 mm) has an optical absorption coefficient at a wavelength of 1.06 μm of less than 0.09 cm$^{-1}$, preferably less than 0.07 cm$^{-1}$. The present invention also enables the fabrication of thick, colourless or near colourless single crystal CVD diamond material which is of high crystal quality with good optical characteristics except for those regions of high stress and birefringence which have been controllably engineered into the material. For example, the single crystal CVD diamond material can be colourless or near colourless with a colour grade in a range D to J. In many respects, embodiments of the present invention comprise portions of material meeting the requirements of WO2004/046427 separated by portions of high birefringence material.

Stress patterns can be observed in birefringence measurements of single crystal CVD diamond material according to embodiments of the invention. Induced dislocations propagate close to the <100> direction and can be perturbed by step flow. For example, fine <110> oriented grooves can be provided in a {100} growth surface of a substrate and the dislocations propagate upwards through the single crystal CVD diamond material grown thereon in a <100> direction with minor perturbations due to step flow. The high strain regions can be separated by an amount such that the dislocations in adjacent high strain regions do not affect each other.

The single crystal CVD diamond material according to the present invention may be used in a range of applications including optical applications, thermal applications, jewellery applications, and as substrates for further CVD diamond growth (e.g. via vertical slicing to form substrates with low defect growth surfaces). For example, the single crystal CVD diamond material may be in the form of a cut gemstone. The high strain regions can also be intentionally patterned to form a distinctive mark viewable, for example, under luminescent conditions, which can function as an indicator of the source of the material or as a personalized design for an end customer. Furthermore, the engineered strain patterns can be used for controlling optical and spin properties of the diamond material.

While this invention has been particularly shown and described with reference to embodiments, it will be understood to those skilled in the art that various changes in form and detail may be made without departing from the scope of the invention as defined by the appending claims.

The invention claimed is:

1. A single crystal CVD diamond material comprising:
   three orthogonal dimensions of at least 2 mm;
   one or more regions of low optical birefringence, indicative of low strain, such that in a sample of the single crystal CVD diamond material having a thickness in a range 0.5 mm to 1.0 mm and an area of greater than 1.3 mm×1.3 mm and measured using a pixel size of area in a range 1×1 μm$^2$ to 20×20 μm$^2$, a maximum value of $\Delta n_{[average]}$ does not exceed $1.5 \times 10^{-4}$ for the one or more regions of low optical birefringence, where $\Delta n_{[average]}$ is an average value of a difference between refractive index for light polarised parallel to slow and fast axes averaged over the sample thickness;
   one or more regions of high optical birefringence, indicative of high strain, such that in said sample of the single crystal CVD diamond material and measured using said pixel size, $\Delta n_{[average]}$ is greater than $1.5 \times 10^{-4}$ and less than $3 \times 10^{-3}$; and
   wherein every 1.3 mm×1.3 mm area of the sample of the single crystal CVD diamond material comprises at least one of said regions of high optical birefringence.

2. The single crystal CVD diamond material according to claim 1,
   wherein the one or more regions of high optical birefringence each comprise a plurality of dislocations extending laterally in a line across the single crystal CVD diamond material.

3. The single crystal CVD diamond material according to claim 1,
wherein the one or more regions of high optical birefringence each comprise a bundle of dislocations at a point localized in lateral dimensions of the single crystal CVD diamond material.

4. The single crystal CVD diamond material according to claim 1,
wherein the one or more regions of high optical birefringence each have a width in a range 5 to 500 μm.

5. The single crystal CVD diamond material according to claim 1,
wherein the regions of high optical birefringence have a spacing in a range 50 μm to 1.3 mm.

6. The single crystal CVD diamond material according to of claim 1,
wherein the regions of high optical birefringence are configured in a regular pattern.

7. The single crystal CVD diamond material according to of claim 1,
wherein the regions of high optical birefringence are equally spaced.

8. The single crystal CVD diamond material according to claim 1,
wherein $\Delta n_{[average]}$ of the one or more regions of low optical birefringence does not exceed $8\times10^{-5}$.

9. The single crystal CVD diamond material according to of claim 1,
wherein $\Delta n_{[average]}$ of the one or more regions of high optical birefringence is greater than $2.5\times10^{-4}$.

10. The single crystal CVD diamond material according to of claim 1,
wherein the single crystal CVD diamond material has a neutral single substitutional nitrogen)($N_s^0$) concentration in a range $3\times10^{15}$ atoms/cm$^3$ to $5\times10^{17}$ atoms/cm$^3$ as measured by electron paramagnetic resonance.

11. The single crystal CVD diamond material according to claim 1,
wherein the single crystal CVD diamond material has a low optical absorption such that said sample of the single crystal CVD diamond material has an optical absorption coefficient at a wavelength of 1.06 μm of less than 0.09 cm$^{-1}$.

12. The single crystal CVD diamond material according to claim 1,
wherein the single crystal CVD diamond material is colourless or near colourless with a colour grade in a range D to J.

13. The single crystal CVD diamond material according to claim 1,
wherein the single crystal CVD diamond material is in the form of a cut gemstone.

14. A method of manufacturing the single crystal CVD diamond material according to claim 1, the method comprising:
preparing a plurality of single crystal diamond substrates, each substrate having a growth surface comprising:
one or more regions for nucleating dislocations to form said one or more regions of high optical birefringence in the single crystal CVD diamond material grown thereon; and one or more low defect regions to form said one or more regions of low optical birefringence in the single crystal CVD diamond material grown thereon, wherein the one or more low defect regions have a density of defects such that surface etch features related to defects formed by a revealing plasma etch is below $5\times10^3$/mm$^2$; and
growing at least 2 mm×2 mm×2 mm of the single crystal CVD diamond material on the growth surface of each of the single crystal diamond substrates while controlling CVD diamond growth conditions in order to fabricate the single crystal CVD diamond material of claim 1.

15. The method according to claim 14,
wherein the single crystal diamond substrates are prepared by ablating the growth surface of each of the single crystal diamond substrates with ablated regions forming the one or more regions for nucleating dislocations.

16. The method according to claim 15,
wherein the ablated regions have a width in a range 5 to 500 μm.

17. The method according to claim 15,
wherein the ablated regions have a depth in a range 5 to 100 μm.

18. The method according to claim 15,
wherein the ablated regions have a spacing in a range 50 μm to 1.3 mm.

19. The method according to claim 14,
wherein the single crystal diamond substrates are prepared by implanting the growth surface of each of the single crystal diamond substrates with implanted regions forming the one or more regions for nucleating dislocations.

20. The method according to claim 14,
wherein the single crystal diamond substrates are prepared by etching the growth surface after forming the one or more regions for nucleating dislocations, the etching being controlled to remove processing damage from the one or more low defect regions but not to fully remove the one or more regions for nucleating dislocations such that said regions for nucleating dislocations are in a form capable of generating sufficient dislocations in the single crystal CVD diamond material grown thereon that $\Delta n_{[average]}$ is greater than $1.5\times10^{-4}$ and less than $3\times10^{-3}$ thus forming the regions of high optical birefringence.

* * * * *